United States Patent
Baryudin et al.

(10) Patent No.: US 8,775,727 B2
(45) Date of Patent: Jul. 8, 2014

(54) LOOKUP ENGINE WITH PIPELINED ACCESS, SPECULATIVE ADD AND LOCK-IN-HIT FUNCTION

(75) Inventors: Leonid Baryudin, San Jose, CA (US); Earl T. Cohen, Oakland, CA (US); Kent Wayne Wendorf, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 189 days.

(21) Appl. No.: 13/600,464

(22) Filed: Aug. 31, 2012

(65) Prior Publication Data

US 2014/0068176 A1 Mar. 6, 2014

(51) Int. Cl.
*G06F 13/10* (2006.01)

(52) U.S. Cl.
USPC ........................................ 711/108

(58) Field of Classification Search
None
See application file for complete search history.

(56) References Cited

U.S. PATENT DOCUMENTS

| | | | |
|---|---|---|---|
| 6,813,266 B1 | 11/2004 | Chiang et al. | |
| 6,876,558 B1 | 4/2005 | James et al. | |
| 6,915,307 B1 | 7/2005 | Mattis et al. | |
| 7,007,151 B1 | 2/2006 | Ely et al. | |
| 7,023,807 B2 | 4/2006 | Michels et al. | |
| 7,177,276 B1 | 2/2007 | Epps et al. | |
| 2002/0159466 A1 | 10/2002 | Rhoades | |
| 2006/0004956 A1 | 1/2006 | Madajczak | |
| 2008/0052488 A1* | 2/2008 | Fritz et al. | ...................... 711/216 |
| 2011/0289180 A1 | 11/2011 | Sonnier et al. | |

OTHER PUBLICATIONS

Stefan Nilsson et al, IP-Address Lookup Using LC-Tries, IEEE Jornal on Selected Areas in Communications, vol. 17, No. 6, Jun. 1999.*

* cited by examiner

*Primary Examiner* — Duc Doan

(57) ABSTRACT

Described embodiments provide a lookup engine that receives lookup requests including a requested key and a speculative add requestor. Iteratively, for each one of the lookup requests, the lookup engine searches each entry of a lookup table for an entry having a key matching the requested key of the lookup request. If the lookup table does not include an entry having a key matching the requested key, the lookup engine sends a miss indication corresponding to the lookup request to the control processor. If the speculative add requestor is set, the lookup engine speculatively adds the requested key to a free entry in the lookup table. Speculatively added keys are searchable in the lookup table for subsequent lookup requests to maintain coherency of the lookup table without creating duplicate key entries, comparing missed keys with each other or stalling the lookup engine to insert missed keys.

21 Claims, 4 Drawing Sheets

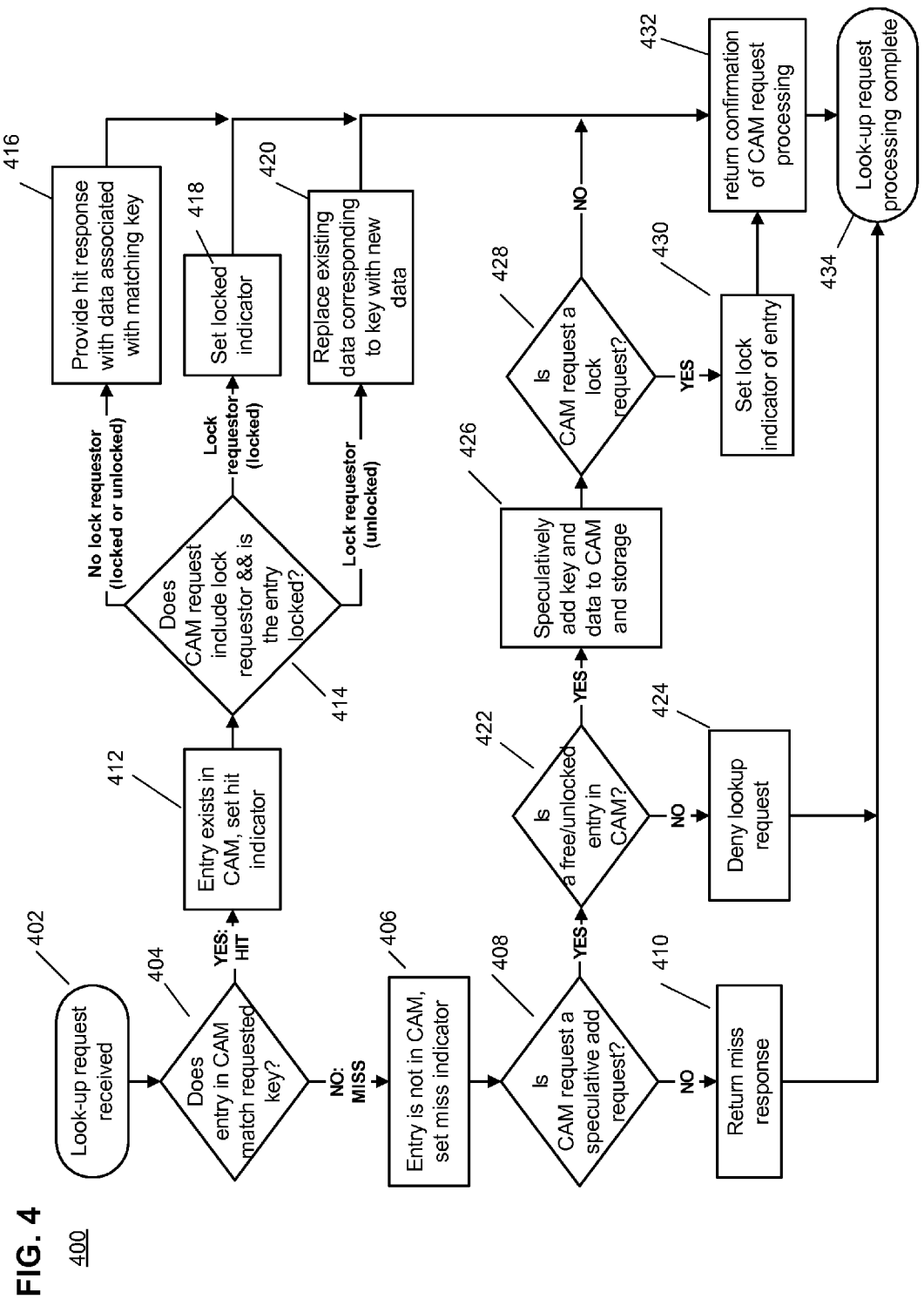

LOOKUP ENGINE WITH PIPELINED ACCESS, SPECULATIVE ADD AND LOCK-IN-HIT FUNCTION

CROSS-REFERENCE TO RELATED APPLICATIONS

The subject matter of this application is related to PCT patent application no. PCT/US12/49905 filed on Aug. 8, 2012, the teachings of which are incorporated herein in their entireties by reference.

BACKGROUND

A lookup engine having a lookup table data structure, usually an array or associative array, is often used to replace a runtime computation with an array indexing operation. A lookup table typically matches an input request against a list of a plurality of entries in the array, each entry associated with a "key". A given key might match one or more entries in the look up table. The lookup engine might typically process requests to access the lookup table by receiving a key, searching the lookup table, and returning either a miss (the key is not in the table) or a hit (the key is in the table) along with the index of the table entry that hit and possibly some associated data. A content-addressable memory (CAM) (either binary or ternary) is an example of such a lookup engine. A CAM might often be employed, for example, in network routers to determine a route corresponding to a received data packet by looking up a destination network address in a network routing table stored in the CAM.

Increased performance of a lookup engine might be achieved by allowing multiple lookup requests to be "in-flight" or pending at a time. However, when multiple lookup requests are pending at a time, maintaining coherency between the pending lookup requests could introduce significant processing delays, erroneous duplicate keys, or erroneous misses being returned.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a lookup engine that receives lookup requests including a requested key and a speculative add requestor. Iteratively, for each one of the lookup requests, the lookup engine searches each entry of a lookup table for an entry having a key matching the requested key of the lookup request. If the lookup table includes an entry having a key matching the requested key, the lookup engine sends a hit indication corresponding to the lookup request to a control processor. If the lookup table does not include an entry having a key matching the requested key, the lookup engine sends a miss indication corresponding to the lookup request to the control processor. If the speculative add requestor is set, the lookup engine speculatively adds the requested key to a free entry in the lookup table. Speculatively added keys are searchable in the lookup table for subsequent lookup requests to maintain coherency of the lookup table without creating duplicate key entries, comparing missed keys with each other or stalling the lookup engine to insert missed keys.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

FIG. 4 shows a flow diagram of an exemplary process for processing lookup requests by the lookup engine of FIG. 1.

DETAILED DESCRIPTION

Described embodiments provide a pipelined lookup engine allowing multiple lookup requests to be pending at one time, while maintaining data coherency of the lookup table without possibly creating duplicate key entries, comparing all missed keys with each other, or stalling the lookup pipeline to insert missed keys one at a time serially, waiting for each to be inserted, and then looking up the remaining missing keys again.

Table 1 defines a list of acronyms employed throughout this specification as an aid to understanding the described embodiments of the present invention:

TABLE 1

| | | | |
|---|---|---|---|
| AMBA | Advanced Microcontroller Bus Architecture | AXI | Advanced eXtensible Interface |
| CAM | Content Addressable Memory | CPU | Central Processing Unit |
| DMA | Direct Memory Access | DRAM | Dynamic Random Access Memory |
| ECC | Error Correction Code | FC | Fibre Channel |
| FIFO | First-In, First-Out | FLM | First-Level Map |
| I/O | Input/Output | LRU | Least Recently Used |
| PCI-E | Peripheral Component Interconnect Express | PLB | Processor Local Bus |
| RF | Radio Frequency | RoC | RAID-on-a-Chip |
| SAS | Serial Attached SCSI | SATA | Serial Advanced Technology Attachment |
| SCSI | Small Computer System Interface | SLM | Second-Level Map |
| SoC | System-on-Chip | SRIO | Serial Rapid I/O |
| USB | Universal Serial Bus | | |

Figure 1:
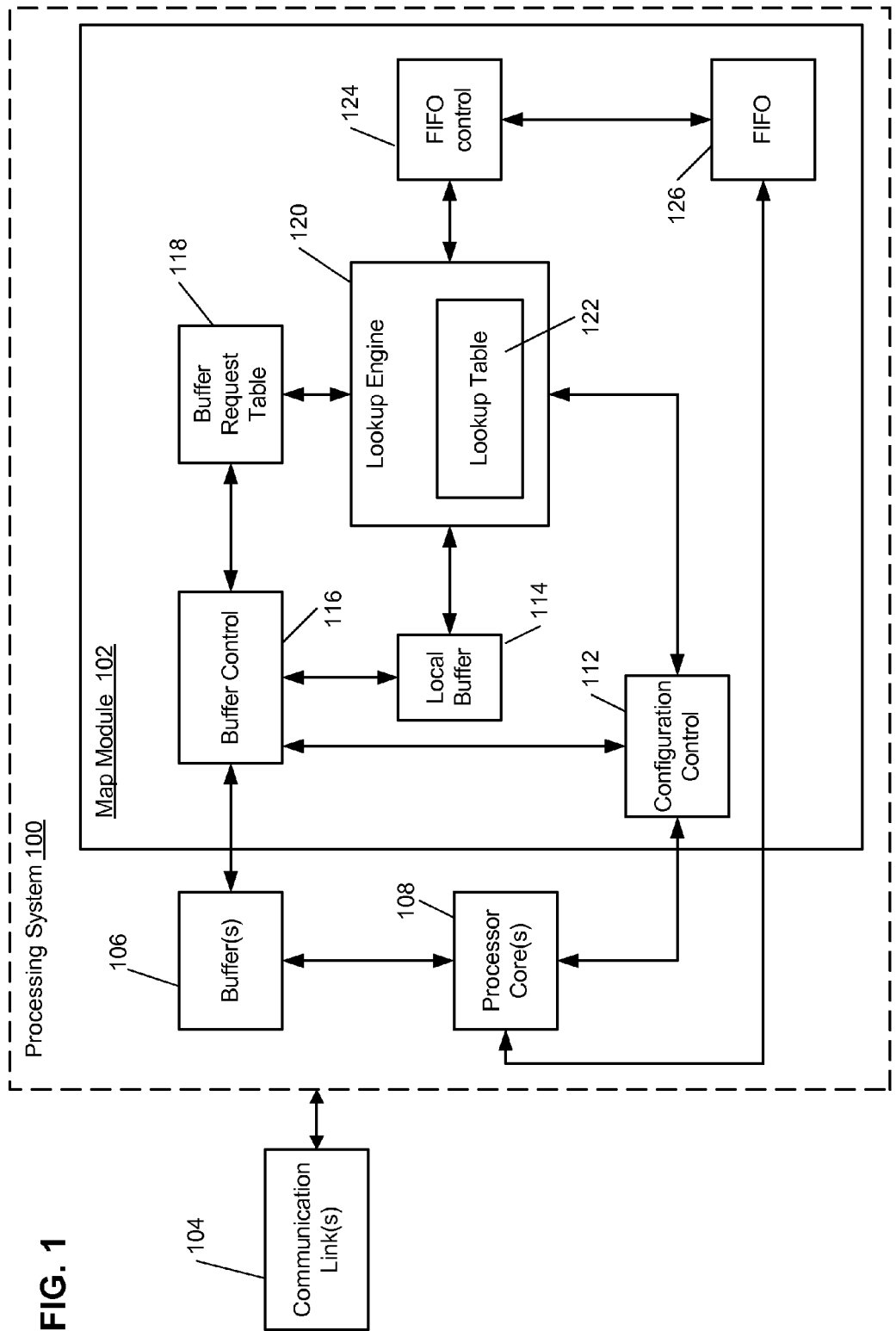
FIG. 1 shows a block diagram of a processing system employing a lookup engine operating in accordance with exemplary embodiments.

FIG. 1 shows a block diagram of an exemplary processing system 100 that employs a lookup engine and lookup table in accordance with described embodiments. In some embodiments, processing system 100 might be implemented as a system-on-chip (SoC). Processing system 100 might typically be used in storage systems, for example in a media controller for interfacing between a host computer and a storage medium each coupled to communication link(s) 104 (e.g., magnetic, optical, solid-state, or hybrid magnetic and solid state storage systems), such as described in related application PCT/US12/49905, incorporated by reference herein. In described embodiments, the storage medium might typically be implemented as non-volatile solid-state memory, such as NAND flash memory. Processing system 100 might also be employed in a RAID-on-a-Chip (RoC) system as a controller for a RAID storage system. As shown in FIG. 1, processing system 100 might interface with one or more external devices through one or more communications links, shown as communication link(s) 104.

Communication link(s) 104 might generally be employed for communication by processing system 100 with one or more external devices, such as a computer system, storage device, or networking device. Communication link(s) 104 might typically be a transmission medium, such as a backplane, drive head in a magnetic recording system, copper cables, optical fibers, one or more coaxial cables, one or more twisted pair copper wires, and/or one or more radio frequency (RF) channels. Communication link(s) 104 might be implemented as one or more of a custom-designed communication link, or might conform to a standard communication protocol such as, for example, a Small Computer System Interface ("SCSI") protocol bus, a Serial Attached SCSI ("SAS") protocol bus, a Serial Advanced Technology Attachment ("SATA") protocol bus, a Universal Serial Bus ("USB"), an Ethernet link, an IEEE 802.11 link, an IEEE 802.15 link, an IEEE 802.16 link, a Peripheral Component Interconnect Express ("PCI-E") link, a Serial Rapid I/O ("SRIO") link, a non-volatile memory chip interface such as a NAND flash interface, or any other interface link.

As shown in FIG. 1, processing system 100 includes one or more processor cores 108. Processor cores 108 might be implemented as Tensilica®, Pentium®, Power PC® or ARM processors or a combination of different processor types (Tensilica® is a registered trademark of Tensilica, Inc., Pentium® is a registered trademark of Intel Corporation, ARM processors are by ARM Holdings, plc, and Power PC® is a registered trademark of IBM). Each of processor cores 108 might be in communication with a buffer, shown as buffer(s) 106. Processor cores 108 and buffers 106 might each be in communication with map module 102.

As shown in FIG. 1, map module 102 includes lookup engine 120. Lookup engine 120 includes lookup table 122. In some embodiments, lookup engine 120 is implemented as either a binary or ternary content addressable memory (CAM). Lookup engine 120 is coupled to configuration control 112, local buffer 114, buffer request table 118 and FIFO control 124. Configuration control 112 is coupled to processor cores 108 and buffer control 116. Configuration control 112 might typically modify configuration settings of map module 102, for example, to account for different implementations of communication link(s) 104 or different types of devices coupled to communication link(s) 104, or to configure different modes of operation of lookup engine 120 (e.g., a maximum number of entries of lookup table 122, etc.). Local buffer 114 is coupled to buffer control 116 and might be employed to temporarily buffer data from buffers 106 for use by lookup engine 120. Lookup engine 120 might request to store data from buffers 106 in local buffer 114 via buffer request table 118 and buffer control 116.

Lookup engine 120 might process lookup table requests from processor core(s) 108 by reading or writing data from buffer(s) 106 via buffer control 116 and local buffer 114. Since buffer(s) 106 might have some latency, multiple data read or write requests might be processed between buffer control 116 and buffer(s) 106 at any given time, and buffer request table 118 might be employed to track the progress of the various in-process operations. Lookup engine 120 might control the operations of lookup table requests that are sent from processor core(s) 108 to FIFO 126 via FIFO control 124. Lookup engine 120 might be also responsible for handling locking operations, as described herein.

Figure 2:
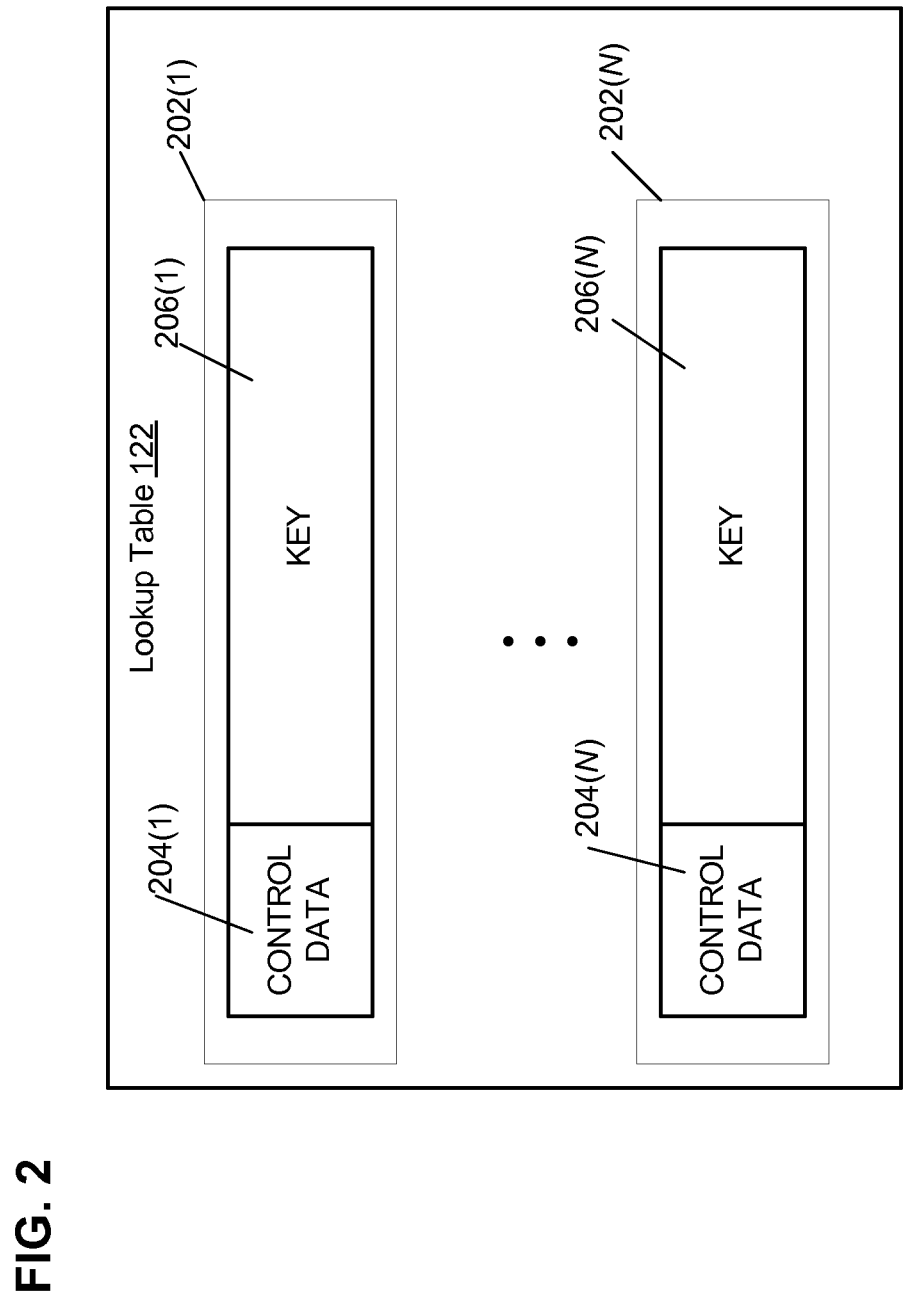
FIG. 2 shows a exemplary lookup table of the lookup engine of FIG. 1.

As shown in FIG. 2, lookup table 122 might store up to N entries, 202(1)-202(N), each of which entries might include a key, shown as 206, and various control data, shown as 204. In some embodiments, control data 204 for each entry of lookup table 122 might include a valid indicator, a lock indicator, and ECC and/or parity data. Lookup requests and responses by lookup engine 120 might include some or all of control data 204 and additional control data, such as a hit indicator, a miss indicator, and additional data corresponding to a key, such as one or more addresses or pointers corresponding to the key. In some embodiments, all N entries in lookup table 122 might be searchable in a single cycle, for example, by having each entry compared in parallel and providing each entry with a corresponding match signal. In some embodiments, lookup table 122 might store up to 128 entries.

Lookup engine 120 searches lookup table 122 for a requested key corresponding to a lookup table request from processing core(s) 108. If the key is found, lookup table 122 might return a list of one or more storage addresses (e.g., in a storage media coupled to communication link(s) 104) corresponding to the key. Lookup engine 120 might provide any returned data corresponding to a key to processor core(s) 108. If there are no matches, a miss signal might be returned by lookup engine 120 to processor core(s) 108. If multiple matches occur, then an error signal might be returned by lookup engine 120 to processor core(s) 108. Thus, in some embodiments, lookup table 122 might be employed to map a logical address employed by a host device coupled to processing system 100 to one or more physical addresses in a storage device coupled to processing system 100.

Lookup engine 120 might typically process lookup requests serially (e.g., in the order in which the requests are received), but over a span of multiple cycles and, thus, embodiments of lookup engine 120 might beneficially employ pipeline stages. One pipeline stage might determine, in a first cycle, hits and misses of received lookup requests in lookup table 122. At this stage, if there is a miss and a speculative add is requested, the missing entry might be added to a free location in table 122. If a lock is requested, the entry (hit or speculatively added) might be locked. On a following cycle, a subsequent lookup request received by the first stage thus might be able to search table 122, including the results of any previous speculative add requests, thus allowing data coherency of lookup table 122 among the full pipeline of lookup operations. For example, if two requests in the pipeline both had the same key value, the first request might be a table miss, but could then be speculative added to lookup table 122. Thus, speculatively added entries might be return hits for any subsequent lookup operations. Thus, in described embodiments, processor core(s) 108 might submit a series of lookup requests via FIFO 126 without ambiguity that could otherwise result from one or more of the lookup requests returning misses when multiple requests are pending. By enabling lookup requests to speculatively add a key on a miss, all misses returned by subsequent lookup requests that were all pending at the same time are for unique keys.

Figure 3:
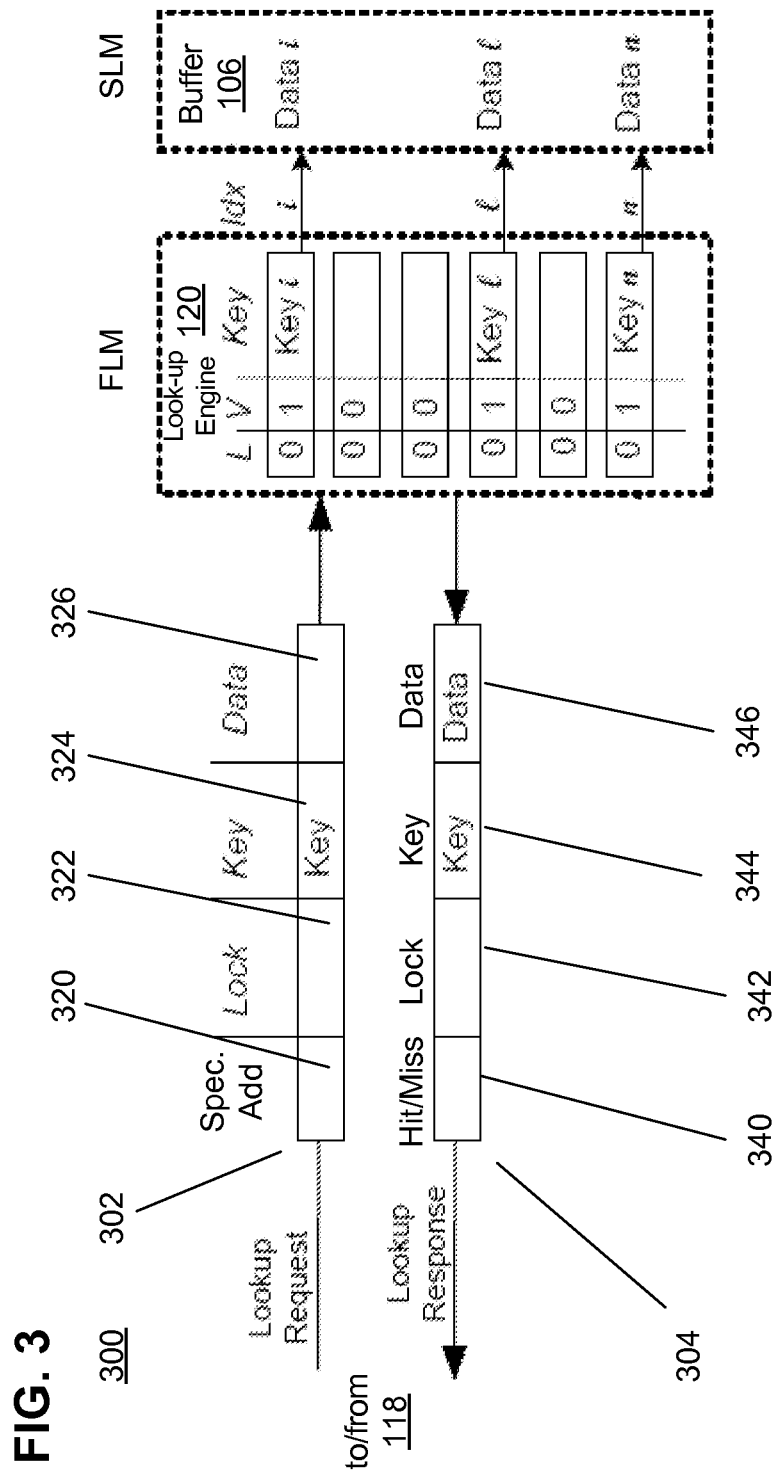
FIG. 3 shows an exemplary logical block diagram of a lookup operation of the lookup engine of FIG. 1.

FIG. 3 shows an exemplary logical block diagram of a lookup operation of lookup engine 122. As shown in FIG. 3, a given key might correspond to one or more locations in a storage device, such as buffer 106 or a storage medium coupled to processing system 100, containing data associated with the key. Thus, as shown in FIG. 3, lookup engine 120 might serve as part of a multi-level mapping system, where a first-level map (FLM) map index serves as a key to one or more addresses of data in a storage device, such as buffer 106, and the data stored in buffer 106 might serve as all or a portion of a second-level map (SLM) to data stored elsewhere, for example in a storage medium coupled to processing system 100.

As shown in FIG. 3, exemplary lookup request 302 from processor core(s) 108 might include requested key 324. Lookup request 302 might also include associated data 326. As described herein, lookup engine 120 searches lookup table 122 for an entry having a key matching the requested key. As shown, lookup table 122 might include multiple entries, each entry including a key and control data shown in FIG. 3 as a lock indicator (L) and a valid indicator (V). When valid indicator V is set, the corresponding key is valid, and, if the key matches a requested key, lookup response message 304 might be returned by lookup engine 120 having hit indicator 340 set to indicate a hit, key 344 containing the matching key and data 346 including any data associated with the matching key. In some embodiments, key 344 might not be returned by lookup engine 120 when there is a hit, since the matching key corresponding to the request is known. Alternatively, data associated with the matching key might be overwritten with new data, for example, if lookup request 302 included new data in data field 326. However, when lock indicator L of an entry is set, the entry is locked and, thus, data associated with the matching key cannot be overwritten, the key entry cannot be modified, etc. Entry locking might ensure that the entry that has been found might not be replaced or modified by subsequent operations before a higher-level operation (e.g., of processor core(s) 108) corresponding to the first matching request is complete. If lock indicator L is set, and the lookup request included new data 326, lookup response might include lock indicator 342 to indicate that the lookup request hit on a locked entry.

As shown in FIG. 3, lookup request 302 might also include speculative add requestor 320 and lock requestor 322. Speculative add requestor 320 might be employed for lookup engine 120 to speculatively add requested key 324 and/or data field 326 if there is not a matching key in lookup table 122, to an entry to lookup table 122. In some embodiments, a speculative add lookup request might also include a desired entry number within lookup table 122 where the speculative entry should be added. Lookup request 302 might also include lock requestor 322. In some embodiments, when lookup request 302 is performed as part of a higher-level write operation (e.g., processor core(s) 108 writing data to an entry in lookup table 122), lookup request 302 might request, via lock requestor 322, to lock the corresponding entry in lookup table 122 such that subsequent requests cannot modify the entry until it is unlocked by completion of the prior higher-level write operation. Speculative add and lock operations will be described in greater detail in regard to FIG. 4.

FIG. 4 shows a flow diagram of lookup request process 400 of lookup engine 120. As shown, at step 402, lookup engine 120 receives a lookup request (e.g., a next lookup request from processor core(s) 108 via FIFO 126. At step 404, lookup engine 120 searches lookup table (CAM) 122 for a key corresponding to the received lookup request. If, at step 404, an entry in lookup table 122 matches the requested key, then at step 412 lookup engine 120 sets a hit indicator corresponding to the requested key. At step 414, lookup engine 120 determines whether the lookup request enables the lock requestor (e.g., as in the case of a higher-level write operation to modify data associated with the matching key), does not enable the lock requestor (e.g., as in the case of a higher-level read operation to read data associated with the matching key), and whether the entry corresponding to the matching key is locked (e.g., by checking lock indicator L corresponding to the entry).

If, at step 414, the lookup request does not enable the lock requestor (e.g., read operation), regardless of whether the corresponding entry is locked, at step 416 lookup engine 120 provides a hit response with a hit indication set and any data associated with the matching key. In some embodiments, the hit response might also include an indication whether the entry was locked. Process 400 proceeds to step 432. If, at step 414, the lookup request does enable the lock requestor (e.g., a write operation), and the corresponding entry is locked, at step 418 lookup engine 120 provides a hit response with the hit indication set and with the lock indication set, and does not overwrite or modify any data corresponding to the matching key. In such cases, the higher-level operation corresponding to the lookup request might be queued such that the lookup request is replayed when the lock is cleared. Process 400 then proceeds to step 432. If, at step 414, the lookup request does enable the lock requestor (e.g., a write operation), and the corresponding entry is unlocked, at step 420 lookup engine 120 overwrites any data associated with the matching key (e.g., with new data from field 326 of the lookup request) and sets the lock indication of the corresponding entry. Process 400 proceeds to step 432.

If, at step 404, no entry in lookup table 122 matches the requested key, then at step 406 lookup engine 120 sets a miss indicator corresponding to the requested key. At step 408, if the lookup request is a speculative add request (e.g., speculative add requestor 320 of the lookup request is set), then, at step 422, lookup engine 120 determines if an entry is available in lookup table 122 to write the speculative add data.

Determination of a free entry might be done in various ways, for example, by firmware providing a free entry for use as part of the speculative add request, by the lookup engine managing free entries itself, by aging out entries in lookup table 122, for example by a least recently used (LRU) or other algorithm, etc. In some embodiments, if the lookup request specified an entry in which to write the speculative add request, lookup engine 120 determines whether the specified entry is unlocked. If the specified entry is unlocked, at step 426, lookup engine 120 adds the requested key and any associated data to the specified entry of lookup table 122 and optionally or selectively to the storage medium (e.g., buffer 106). In further embodiments, the speculative add request also sets the lock indicator L of the specified entry, advantageously preventing the specified entry from being overwritten, such as by another speculative add request, until a higher-level operation completes (e.g., an operation by processor core(s) 108). For example, a lookup request that does not match any entry in lookup table 122 implies that a corresponding data structure, such as a second-level map page, is to be fetched into buffer 106, and setting the lock indicator L of the specified entry until the fetch is complete ensures that the specified entry does not get overwritten, such as by a subsequent speculative add request before the higher-level operation is complete.

In other embodiments, if the lookup request did not specify an entry in which to write the speculative add request, lookup engine 120 might determine whether any entry in lookup table 122 is free or unlocked. If an entry is free or unlocked, at step 426, lookup engine 120 adds the requested key and any associated data to the free/unlocked entry of lookup table 122 and optionally or selectively to the storage medium (e.g., buffer 106).

In some embodiments, speculatively added entries might be marked as such, and subsequent hits in the speculatively added entries might return an indication of that status, until that status is cleared. In other embodiments, speculatively added entries might be marked by setting lock indicator L, and subsequent hits in the speculatively added entries might return an indication of the locked status, until lock indicator L is cleared. Process 400 then proceeds to step 428. If, at step 422, there is not a free or unlocked entry available in lookup table 122, lookup engine 120 might deny or reject the lookup request at step 424. If a lookup request is denied or rejected, all lookup requests in the pipeline might be replayed to ensure incorrect hit/miss responses were not returned. Process 400 proceeds to step 434, where process 400 completes.

In some embodiments, at step 428, after the requested key and any associated data is speculatively added, lookup engine 120 determines whether the lock requestor (e.g., 322 of FIG. 3) is set and, if so, at step 430 sets the lock indicator L corresponding to the speculatively added entry in lookup table 122. If the speculative add request was not a lock request (e.g., 322 of FIG. 3 is not set), process 400 proceeds to step 432.

At step 432, lookup engine 120 might provide additional responses to processor core(s) 108 (e.g., a confirmation that a request is complete and that a corresponding lock indicator is cleared, etc.). At step 434, process 400 completes.

At step 408, if the lookup request is not a speculative add request, then, at step 410, lookup engine 120 returns the miss indicator set at step 406 to processor core(s) 108. Process 400 proceeds to step 434, where process 400 completes.

Pipelining in the lookup engine might be increased for some implementations because on a miss, lookup engine 120 might require a relatively large RAM (e.g., an off-chip DRAM) to obtain extra information relevant to the miss. Such operations might increase the latency of all lookup requests, since all requests might be kept in order, so that responses might be returned in order. In other embodiments, the lookup engine itself might be pipelined and take multiple cycles to determine a hit and/or miss.

As described herein, exemplary embodiments provide a lookup engine that receives lookup requests including a requested key and a speculative add requestor. Iteratively, for each one of the lookup requests, the lookup engine searches each entry of a lookup table for an entry having a key matching the requested key of the lookup request. If the lookup table includes an entry having a key matching the requested key, the lookup engine sends a hit indication corresponding to the lookup request to a control processor. If the lookup table does not include an entry having a key matching the requested key, the lookup engine sends a miss indication corresponding to the lookup request to the control processor. If the speculative add requestor is set, the lookup engine speculatively adds the requested key to a free entry in the lookup table. Speculatively added keys are searchable in the lookup table for subsequent lookup requests to maintain coherency of the lookup table without creating duplicate key entries, comparing missed keys with each other or stalling the lookup engine to insert missed keys.

While the exemplary embodiments have been described with respect to processing blocks in a software program, including possible implementation as a digital signal processor, micro-controller, or general-purpose computer, the present invention is not so limited. As would be apparent to one skilled in the art, various functions of software might also be implemented as processes of circuits. Such circuits might be employed in, for example, a single integrated circuit, a multi-chip module, a single card, or a multi-card circuit pack.

Described embodiments might also be embodied in the form of methods and apparatuses for practicing those methods. Described embodiments might also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Described embodiments might can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. Described embodiments might also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various described embodiments.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts that have been described and illustrated in order to explain the nature of this invention might be made by those skilled in the art without departing from the scope of the invention as expressed in the following claims.

We claim:

1. A method of processing lookup requests by a system comprising a lookup engine coupled to a lookup table having a plurality of entries, the method comprising:
  receiving, by the lookup engine, a plurality of lookup requests, each lookup request comprising (i) a requested key and (ii) a speculative add requestor;
  iteratively, for each one of the plurality of lookup requests:
    searching, by the lookup engine, each of the plurality of entries of the lookup table for an entry having a key matching the requested key of the lookup request;
    if the lookup table includes an entry having a key matching the requested key:
      sending, by the lookup engine to a corresponding control processor, a hit indication corresponding to the lookup request;

if the lookup table does not include an entry having a key matching the requested key:
    sending, by the lookup engine to a corresponding control processor, a miss indication corresponding to the lookup request;
    if the speculative add requestor is set, speculatively adding, by the lookup engine, the requested key to a free entry in the lookup table;
wherein speculatively added keys are searchable in the lookup table for subsequent ones of the plurality of lookup requests, thereby maintaining data coherency of the lookup table without (i) creating duplicate key entries, (ii) comparing missed keys with each other, and (iii) stalling the lookup engine to insert missed keys.

2. The method of claim 1, wherein the plurality of lookup requests are received by the lookup engine prior to the lookup engine sending a miss indication of a missed lookup request.

3. The method of claim 1, wherein the speculative add requestor further comprises a desired entry of the lookup table in which to store the requested key.

4. The method of claim 3, further comprising:
determining if the desired entry of the lookup table is free based on at least one of a valid indicator of the desired entry of the lookup table and a lock indicator of the desired entry of the lookup table.

5. The method of claim 4, further comprising:
if the lock indicator of the desired entry of the speculative add requestor is set:
    sending, by the lookup engine to a corresponding control processor, a request rejection indication corresponding to the rejected speculative add requestor.

6. The method of claim 3, further comprising:
determining one or more free entries of the lookup table based on at least one of a valid indicator of the desired entry of the lookup table and a lock indicator of the desired entry of the lookup table.

7. The method of claim 6, further comprising:
clearing a valid indicator of a corresponding entry based on a least recently used (LRU) algorithm; and
selectively setting the lock indicator of the desired entry according to a lock requester of one of the lookup requests.

8. The method of claim 1:
wherein each lookup request comprises a lock requestor; and
wherein each entry in the lookup table comprises a lock indicator;
the method further comprising:
    if the lock requestor of the lookup request is set, setting the lock indicator corresponding to the entry in the lookup table having a key matching the requested key, thereby preventing erasing, modifying or overwriting any data associated with the locked entry.

9. The method of claim 8, wherein the hit indication corresponding to the lookup request comprises an indication of at least one of a state of the lock indicator of the corresponding entry of the lookup table and a state of the valid indicator of the corresponding entry of the lookup table.

10. The method of claim 8, further comprising:
if the lookup table includes an entry having a key matching the requested key of one of the lookup requests, and the lock indicator of the corresponding entry is set:
    if the lock requestor of a subsequent lookup request to the corresponding entry is set:
        sending, by the lookup engine to a corresponding control processor, a locked indication corresponding to the lookup request, the locked indication comprising an identifier of the entry having the matching key.

11. The method of claim 10, further comprising:
if the lock requestor of a subsequent lookup request to the corresponding entry is not set:
    sending, by the lookup engine to a corresponding control processor, data associated with the corresponding entry.

12. The method of claim 1, further comprising:
storing, in each entry of the lookup table, an associated one or more indices to data stored in a storage device of the system.

13. The method of claim 1, wherein, for the method, the lookup engine comprises a content-addressable memory (CAM).

14. A non-transitory machine-readable medium, having encoded thereon program code, wherein, when the program code is executed by a machine, the machine implements a method of processing lookup requests by a system comprising a lookup engine coupled to a lookup table having a plurality of entries, the method comprising:
receiving, by the lookup engine, a plurality of lookup requests, each lookup request comprising a (i) requested key and (ii) a speculative add requestor;
iteratively, for each one of the plurality of lookup requests:
    searching, by the lookup engine, each of the plurality of entries of the lookup table for an entry having a key matching the requested key of the lookup request;
    if the lookup table includes an entry having a key matching the requested key:
        sending, by the lookup engine to a corresponding control processor, a hit indication corresponding to the lookup request;
    if the lookup table does not include an entry having a key matching the requested key:
        sending, by the lookup engine to a corresponding control processor, a miss indication corresponding to the lookup request;
        if the speculative add requestor is set, speculatively adding, by the lookup engine, the requested key to a free entry in the lookup table;
wherein speculatively added keys are searchable in the lookup table for subsequent ones of the plurality of lookup requests, thereby maintaining data coherency of the lookup table without (i) creating duplicate key entries, (ii) comparing missed keys with each other, and (iii) stalling the lookup engine to insert missed keys,
wherein the plurality of lookup requests are received by the lookup engine prior to the lookup engine sending a miss indication of a missed lookup request.

15. The non-transitory machine-readable medium of claim 14, wherein the speculative add requestor further comprises a desired entry of the lookup table in which to store the requested key, the method further comprising:
determining if the desired entry of the lookup table is free based on at least one of a valid indicator of the desired entry of the lookup table and a lock indicator of the desired entry of the lookup table.

16. The non-transitory machine-readable medium of claim 14:
wherein each lookup request comprises a lock requestor; and
wherein each entry in the lookup table comprises a lock indicator;
the method further comprising:

if the lock requestor of a lookup request is set, setting the lock indicator corresponding to an entry in the lookup table having a key matching the requested key, thereby preventing erasing, modifying or overwriting any data associated with the locked entry.

17. The non-transitory machine-readable medium of claim 16, wherein the hit indication corresponding to the lookup request comprises an indication of at least one of a state of the lock indicator of the corresponding entry of the lookup table and a state of the valid indicator of the corresponding entry of the lookup table.

18. The non-transitory machine-readable medium of claim 17, further comprising:
if the lookup table includes an entry having a key matching the requested key of one of the lookup requests, and the lock indicator of the corresponding entry is set:
if the lock requestor of a subsequent lookup request to the corresponding entry is set:
sending, by the lookup engine to a corresponding control processor, a locked indication corresponding to the lookup request, the locked indication comprising an identifier of the entry having the matching key.

19. A system comprising:
a lookup engine coupled to a lookup table having a plurality of entries each comprising a lock indicator;
the lookup engine configured to:
receive, from a corresponding control processor, a plurality of lookup requests, each lookup request comprising (i) a requested key, (ii) a speculative add requestor and (iii) a lock requestor;
iteratively, for each one of the plurality of lookup requests:
search each of the plurality of entries of the lookup table for an entry having a key matching the requested key of the lookup request;
if the lookup table includes an entry having a key matching the requested key:
send, to a corresponding control processor, a hit indication corresponding to the lookup request;
if the lookup table does not include an entry having a key matching the requested key:
send, to a corresponding control processor, a miss indication corresponding to the lookup request;
if the speculative add requestor is set, speculatively adding, by the lookup engine, the requested key to a free entry in the lookup table;
if the lock requestor of the lookup request is set, setting the lock indicator corresponding to the entry in the lookup table having a key matching the requested key, thereby preventing erasing, modifying or overwriting any data associated with the locked entry;
wherein speculatively added keys are searchable in the lookup table for subsequent ones of the plurality of lookup requests, thereby maintaining data coherency of the lookup table without (i) creating duplicate key entries, (ii) comparing missed keys with each other, and (iii) stalling the lookup engine to insert missed keys.

20. The system of claim 19, wherein:
the lookup engine comprises a content-addressable memory (CAM);
the system is coupled to one or more communication links, the communication links comprising at least one of a Small Computer System Interface ("SCSI") link, a Serial Attached SCSI ("SAS") link, a Serial Advanced Technology Attachment ("SATA") link, a Universal Serial Bus ("USB") link, a Fibre Channel ("FC") link, an Ethernet link, an IEEE 802.11 link, an IEEE 802.15 link, an IEEE 802.16 link, and a Peripheral Component Interconnect Express (PCI-E) link; and
a storage device is coupled to one or more of the communication links, the storage device comprising at least one of a magnetic, optical, solid-state, and hybrid magnetic and solid state storage device,
wherein the system is configured to interface between a host device and the storage device.

21. The system of claim 19, wherein the system is implemented in an integrated circuit chip.

\* \* \* \* \*